HERMETICALLY SEALED ELECTRICAL DEVICE

Filed Nov. 22, 1967

WITNESSES

Lee P. Johns

Edwin E. Bassler

INVENTOR

Joseph E. Zido

BY C. L. Menzemer

ATTORNEY

United States Patent Office 3,475,662

Patented Oct. 28, 1969

3,475,662

HERMETICALLY SEALED ELECTRICAL DEVICE

Joseph E. Zido, Donora, Pa., assignor to Westinghouse Electric Corporation, Pittsburgh, Pa., a corporation of Pennsylvania Filed Nov. 22, 1967, Ser. No. 685,133
Int. Cl. H01l 1/02, 15/00
U.S. Cl. 317—234 9 Claims

ABSTRACT OF THE DISCLOSURE

A hermetically sealed electrical device having a base member and a header member with a semiconductor element hermetically enclosed therebetween. The base member is composed of a metal having a good thermal conductivity and having upper and lower surfaces, the upper surface having an outer peripheral bevelled portion, and the base and header members having corresponding interfitting surfaces and interlocking means therebetween.

BACKGROUND OF THE INVENTION

Field of the invention

This invention relates to electrical devices having improved hermetic seals.

Description of the prior art

In the semiconductor industry there is a growing tendency to encapsulate semiconductor components in thermosetting resinous insulating material. Several problems are incurred with semiconductor components encapsulated in thermosetting resinous materials. The problems primarily involve a bond between the thermosetting resin and the metallic base. Among other things the resin may separate from the metal base due to difference between the coefficients of thermal expansion of the resin and metal. In addition, the bond between the resinous header member and the metal base may be damaged inadvertently during handling and shipping.

Associated with the foregoing is a problem of cracking of the resin due to internal stresses between the metal base and the resin. Each stresses are magnified by subjecting the device to temperature cycling which aggravates the tendency to crack and increases the percentage of rejection during inspection.

In accordance with this invention it has been found that the foregoing problems may be overcome by providing a hermetically sealed electrical device which includes an interlocking construction between the metal base and the encapsulating resin.

It is another object of this invention to provide a hermetically sealed electrical device in which the integrity of the seal between the resin and the metal base is increased during contraction of the resin upon cooling.

Finally, it is an object of this invention to satisfy the foregoing objects and desiderata in simple and expedient manner.

SUMMARY OF THE INVENTION

The hermetically sealed electrical device of the present invention comprises a metal base member and a thermosetting resinous header member which are sealed together in a fluid-tight manner to form a semiconductor element-containing chamber. Means for sealing the members together including a flange portion of the base member extending upwardly from the upper surface of the base member and the upper surface having a bevelled peripheral portion extending downwardly from the flange to the periphery of the member, the flange having an undercut surface, and the header member being composed of a thermosetting resinous insulating material in sealed contact with the outer peripheral surface portion and with the undercut surface of the flange.

BRIEF DESCRIPTION OF THE DRAWINGS

For a better understanding of the nature and objects of this invention, reference is made to the drawings, in which.

Similar numerals referred to similar parts throughout the several views of the drawings.

Figure 1:
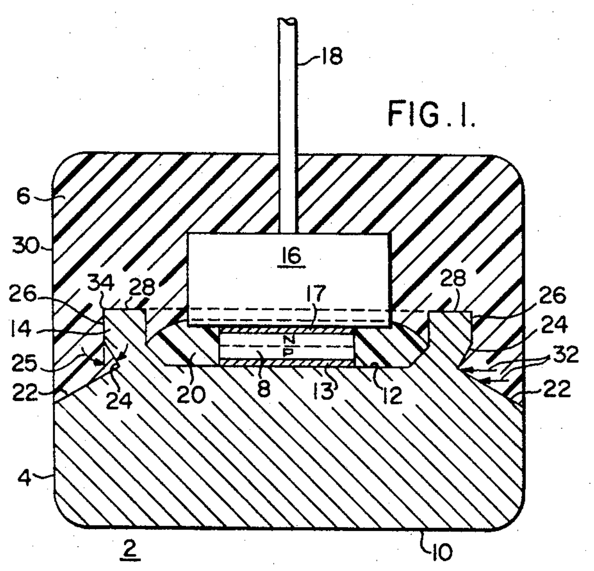
FIGURE 1 is a sectional view of one embodiment of the present invention.

This invention provides a composite article composed essentially of a resinous header mounted on a metal base to provide a fluid-tight housing for an electrical device. By way of example, a semiconductor device 2 is shown in FIG. 1. It includes a base member 4 and a header member 6 which form a housing for a semiconductor wafer 8.

The base member 4, having a bottom surface 10 and a top surface 12, is composed of a metal having good electrical and thermal properties. The member 4 is preferably composed of a metal selected from the group consisting of copper, copper base alloys, silver, silver base alloys, aluminum, aluminum base alloys, and ferrous base alloys. Copper and brass have been found particularly satisfactory.

As shown in FIG. 1, the base member 4 includes a flange 14 as an integral part of and extending upwardly from the top surface 12. The wafer 8 is substantially centrally located on the top surface 12 and is bonded to the member 4 such as by a solder joint 13.

The wafer 8 is composed of an N-type and a P-type region and is bonded to a contact 16 such as by a solder joint 17 on the upper side of the wafer. A lead wire 18 extends from the contact upwardly through the header member 6. The wafer 8 is surrounded in a coating 20 such as a silicone varnish, which prevents current leakage and protects the wafer from contamination and from pressure forces that may be exerted by the thermosetting resinous member 6 during the encapsulation process or thereafter by contraction forces of the thermosetting resinous member during temperature excursions.

The primary purpose of the flange 14 is to retain the header member 6 in place on the base member 4. The member 6 is composed of a resinous material that resists deterioration at elevated temperatures. The resin may be composed of a thermosetting resin such as epoxy, or of some linear polymer such as polyimide or polyamide-imide, all of which resins have good thermal and electrical insulating properties at high temperatures. A preferred resin is an epoxy which is deposited in situ such as by transfer molding on the base member 4 and the flange 14 after which it is cured in place.

Inasmuch as the resins employed as the header member are formulated usually with coeffcients of thermal expansion greater than that of the metal base member, the header and base members of prior construction have frequently separated at their interfaces causing irrepairable damage to the device primarily due to the infiltration of moisture. The separation usually occurs during the initial contraction of the thermosetting resinous member and the base member following the encapsulation process that is performed at elevated temperatures when the header and base members are thermally expanded, as well as during thermal cycling either during inspection or subsequently when in use.

In accordance with this invention the device 2 incorporates several changes in configuration over the prior art devices. First, a peripheral surface 22 of the top surface of the base member 4 is inclined downwardly or bevelled. Second, the flange 14 has an undercut portion as provided by an inwardly inclined surface 24 that intersects the bevelled surface 22. Finally, the flange 14 has an outer surface 26 extending substantially at right angles to a flange top surface 28. More particularly, the outer surface 26 is substantially parallel to or disposed in a plane concentric with the plane of a side surface 30 of the header member 6.

The peripheral surface 22 is bevelled to assure a fluid-tight seal between the header member 6 and the base member 4. After deposition of the header member 6 in a liquid state the assembly of the header and base are heat cured and cooled to room temperature. During cooling the resinous material of the header contracts at a faster rate than the metal base. Thus, the resinous material presses upon the bevellel surface 22 (as indicated by arrows 32), thereby creating a fluid-tight seal between the header and base members.

The function of the undercut portion of the flange 14 is to retain the resinous header member 6 on the base member 4. Any usual force operating to separate the members 4 and 6 is overcome by the opposing force of the inwardly inclined surface 24. For example, the compressive force created by the contracting cooling member 6 on the bevelled surface 22 (arrows 32) has a resultant effect of lifting the header member 6 upwardly and out of snug fitting contact with the flange 14, the varnish coating 20, and the contact 16. However, the inclined surface 24 offsets the lifting action and thereby holds the header member 6 in even tighter sealing contact with the bevelled surface 22. For best results the angle of inclination 25 should be at least 7°.

The outer surface 26 of the flange 14 is preferably disposed at substantially right angles to the top surface 28, rather than at an acute angle, in order to minimize the formation and, build-up of the thermal stresses at a corner or junction 34 of intersection of the surfaces 26 and 28. Where the angle of the junction 34 is acute, the greater the build-up of thermal stresses and therefore, the greater the possibility of the header member 6 cracking between the corner and the nearest outer surface.

Figure 2:
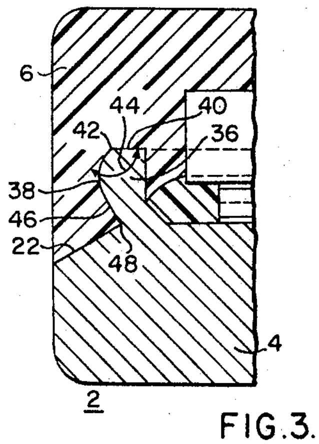
FIGS. 2 to 4 are fragmentary views of other forms of the invention.

Other forms of the invention are shown in FIGS. 2, 3, 4 and 5. In FIG. 2 a flange 36 has a side surface 38 and a top surface 40 which form a junction 42. The angle 44 between these surfaces is greater than 90° and thereby decreases the probability of the development of thermal stresses during cooling. The surface 38 is convex and has a lower portion 46 that turns inwardly and interesects at 48 the bevelled surface 22, thereby providing an undercut zone in the flange 36 similar to that in the flange 14.

Figure 3:
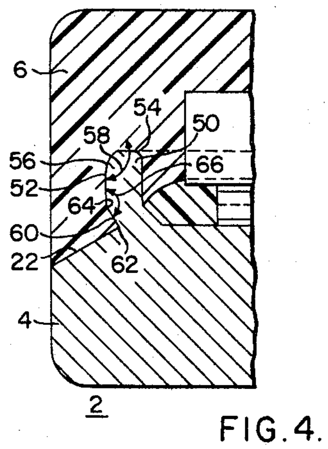

As shown in FIG. 3 a flange 50 has a side surface 52 and a top surface 54 which form a junction 56. The angle 58 between the top and side surfaces is greater than 90°, because the top surface 54 is convex. The side surface 52 is flat as shown, or may be convex like the side surface 38 for FIG. 2. Moreover, the flange 50 has an inturned surface 60 that intersects the bevelled surface 22 to 62, thereby providing an undercut flange portion. The surface 60 forms a junction 64 with the side surface 52 at an angle 66 greater than 90°.

Figure 4:
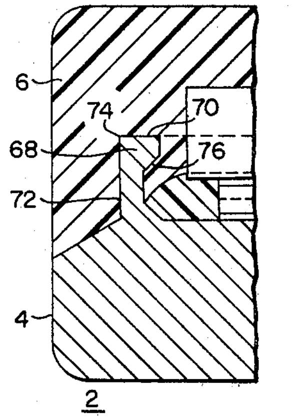

In FIG. 4 a flange 68 has top and side surfaces 70 and 72 which form a junction 74 having an angle of at least 90° to avoid a thermal stress concentration center. But the surfaces 70 and 72 may be convex (not shown) similar to the surfaces 38 and 54 of FIGS. 2 and 3. More particularly, however, the flange 68 on the inner side where a side 76 is inclined radially outwardly to form an undercut portion in order to interlock the header 6 on the base member 4 in a fluid-tight manner.

Figure 5:
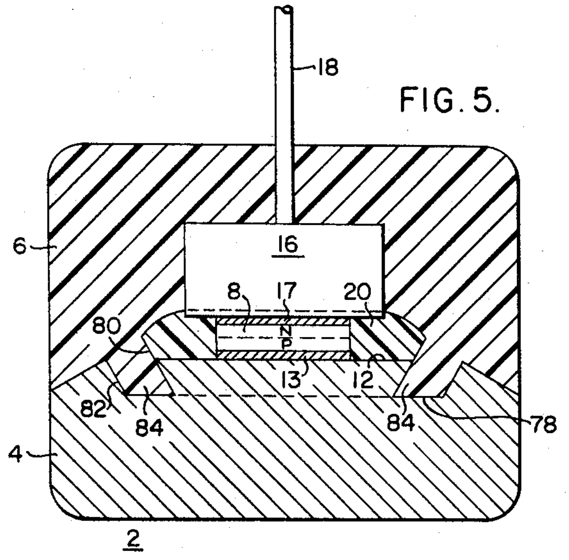
FIG. 5 is a sectional view of another form of the invention.

Finally, another form of the invention is shown in FIG. 5 in which the base member 4 is provided with an annular groove 78 instead of a flange 14 as shown in FIG. 1. The groove 78 is formed by downwardly and inwardly inclined inner and outer walls 80 and 82 to provide an interlocking surface with an annular portion 84 of the header member 6, thereby serving the same purpose as the undercut portion of the flange 14 in FIGS. 1 to 4.

In all forms of the invention the undercut portions of the flange face are open in a direction substantially perpendicular of the longitudinal axis of the base or header members as a means for interlocking the members together. More particularly, the undercut portions of the several flanges 14, 36, 50, and 68 in FIGS. 1 to 4 face outwardly or radially of the longitudinal axis (vertical axis as viewed in the drawings) of the member 2, to hold the header tightly in place on the base. Likewise, the header 6 (FIG. 5) has an undercut portion as provided by the inner wall 80 that faces inwardly or radially of the longitudinal axis of the member 2.

Accordingly, the device of the present invention is provided with structure that avoids the prior art disadvantages and establishes the promotion of hermiticity and a minimization of the influence of destructive thermal stresses between the resinous material forming the header member and the metal base member.

It is understood that the above specification and drawings are merely exemplary and not in limitation of the invention.

What is claimed is:

1. In a hermetically sealed electrical device comprising a metal base member, a resinous header member deposited in situ on the base member in a fluid-tight manner and providing with the base member a compartment adapted to receive a semiconductor element, the improvement comprising the base member having an outer peripheral bevelled portion, the base member being in juxtaposition with and having a surface configuration interfitting a corresponding surface of the header member, and the base and header members having interlocking means therebetween which means include an undercut portion facing radially of the longitudinal axis of the assembled base and header members.

2. The device of claim 1 in which the undercut portion is disposed in one of the base and header members and the other of said members includes a portion conforming with the undercut portion.

3. The device of claim 1 in which the interlocking means includes one of the members having an annular flange and the other of the members having a flange-receiving groove.

4. The device of claim 3 in which the base member includes the flange and the header member includes the flange-receiving groove.

5. The device of claim 4 in which the flange has inner, outer, and interconnecting end wall surfaces and at least one of the outer and end wall surfaces having convexly curved configurations.

6. The device of claim 4 in which the flange has inner, outer, and interconnecting end wall surfaces, and the angle of junction between the outer and end wall surfaces being not less than about 90°.

7. The device of claim 4 in which an undercut surface is disposed on the outer wall side of the flange.

8. The device of claim 4 in which the flange has inner, outer and end wall surfaces, the angle of junction between the outer and end wall surfaces being not less than about 90°, and the outer wall surface of the flange is undercut.

9. The device of claim 4 in which the flanges has outer, inner, and end wall surfaces, the outer wall surface including an upper portion adjacent to and substantially perpendicular to the end wall surface, and the outer wall surface including a lower portion between said upper portion and the outer peripheral portion of the base member and which lower portion is inclined inwardly from the upper portion at angle to said upper portion of at least 7°.

References Cited

FOREIGN PATENTS

| | | |
|---|---|---|
| 926,423 | 5/1963 | Great Britain. |
| 975,573 | 11/1964 | Great Britain. |

JOHN W. HUCKERT, Primary Examiner.

R. F. POLISSACK, Assistant Examiner

U.S. Cl. X.R.

317—235